(12) United States Patent
Rahman et al.

(10) Patent No.: US 11,916,559 B2
(45) Date of Patent: Feb. 27, 2024

(54) DELAY-LOCKED LOOP WITH WIDENED LOCK RANGE

(71) Applicant: SambaNova Systems, Inc., Palo Alto, CA (US)

(72) Inventors: Fahim Ur Rahman, Ruston, LA (US); Jinuk Shin, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 18/090,748

(22) Filed: Dec. 29, 2022

(65) Prior Publication Data
US 2023/0216512 A1 Jul. 6, 2023

Related U.S. Application Data

(60) Provisional application No. 63/295,838, filed on Dec. 31, 2021.

(51) Int. Cl.
| | |
|---|---|
| *H03L 7/10* | (2006.01) |
| *H03H 17/02* | (2006.01) |
| *H03L 7/081* | (2006.01) |
| *H03L 7/093* | (2006.01) |
| *H03H 17/00* | (2006.01) |

(52) U.S. Cl.
CPC ............. *H03L 7/10* (2013.01); *H03H 17/02* (2013.01); *H03L 7/0812* (2013.01); *H03L 7/093* (2013.01); *H03H 2017/0081* (2013.01)

(58) Field of Classification Search
CPC ......... H03L 7/10; H03L 7/0812; H03L 7/093; H03H 17/02; H03H 2017/0081
See application file for complete search history.

(56) References Cited

U.S. PATENT DOCUMENTS

| | | | | |
|---|---|---|---|---|
| 7,277,357 | B1* | 10/2007 | Ma | G11C 29/028 |
| | | | | 331/25 |
| 11,223,362 | B2* | 1/2022 | Chiu | H03L 7/08 |
| 11,239,846 | B1* | 2/2022 | ur Rahman | H03L 7/089 |
| 11,334,109 | B1* | 5/2022 | ur Rahman | H03L 7/089 |
| 11,483,004 | B2* | 10/2022 | Park | H03L 7/0816 |
| 11,545,981 | B1* | 1/2023 | Xanthopoulos | G06F 1/10 |
| 11,722,141 | B1* | 8/2023 | Filippini | H03L 7/0812 |
| | | | | 327/158 |
| 2007/0046344 | A1* | 3/2007 | Minzoni | H03L 7/0814 |
| | | | | 327/158 |
| 2012/0139595 | A1* | 6/2012 | Kamath | H03L 7/0814 |
| | | | | 327/158 |

(Continued)

*Primary Examiner* — Adam D Houston
(74) *Attorney, Agent, or Firm* — Flagship Patents; Sikander M. Khan; Andre Henri Grouwstra

(57) ABSTRACT

A DLL includes a delay line with two phase outputs, a gater coupled with the delay line phase outputs, a PFD coupled with gater outputs, a PD coupled with PFD outputs, a retimer coupled with PD outputs, and a loop filter with inputs coupled with the retimer and a speed control output coupled with the delay line. The gater passes signals on its two inputs to its two outputs, apart from a first pulse on its first input. The PD determines if the second gated signal leads or lags the first gated signal. The retimer retimes PD output signals to be aligned with a delay line input signal. The loop filter uses the retimed PD output signals to determine if the delay line should delay more or delay less, and outputs a speed control signal to control the delay line speed.

17 Claims, 11 Drawing Sheets

(56) References Cited

U.S. PATENT DOCUMENTS

| | | | |
|---|---|---|---|
| 2012/0169388 A1* | 7/2012 | Ma | G11C 29/023 |
| | | | 327/158 |
| 2014/0021990 A1* | 1/2014 | Na | H03L 7/095 |
| | | | 327/158 |
| 2016/0056827 A1* | 2/2016 | Vlachogiannakis | G04F 10/005 |
| | | | 327/158 |
| 2016/0182063 A1* | 6/2016 | Seo | H03L 7/16 |
| | | | 327/149 |
| 2020/0076440 A1* | 3/2020 | Ng | H03L 7/23 |
| 2020/0321968 A1* | 10/2020 | Yeo | H03L 7/085 |
| 2023/0216512 A1* | 7/2023 | Rahman | H03L 7/087 |
| | | | 327/158 |

\* cited by examiner

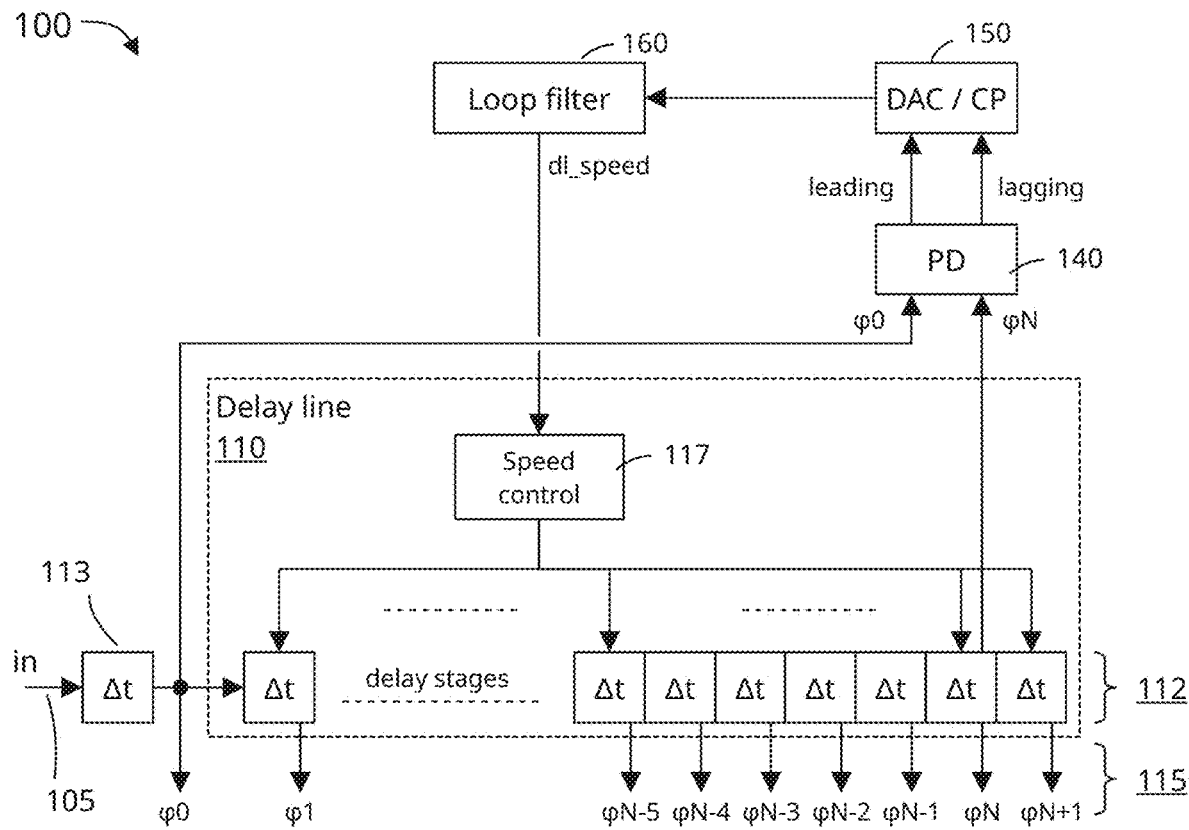
FIG. 1 - PRIOR ART
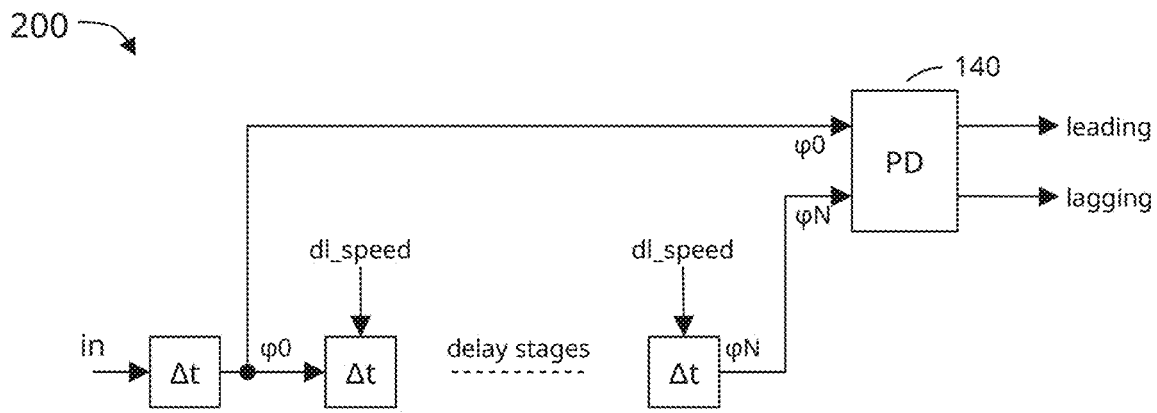
FIG. 2 - PRIOR ART

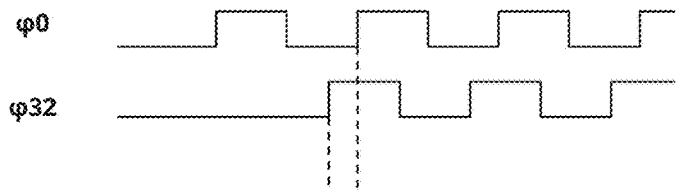
φ32 comes before the second pulse of φ0:
=> leading = 1, lagging = 0
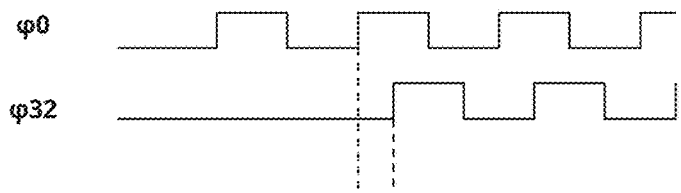
φ32 comes after the second pulse of φ0:
=> leading = 0, lagging = 1
FIG. 3
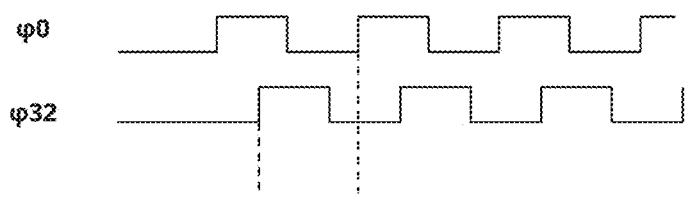
φ32 comes more than 180 degrees before the second pulse of φ0:
=> leading = 0, lagging = 1
=> wrong output values!
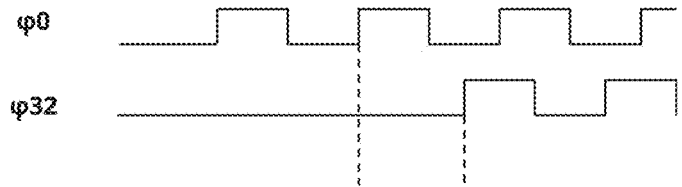
φ32 comes more than 180 degrees after the second pulse of φ0:
=> leading = 1, lagging = 0
=> wrong output values!
FIG. 4 - PRIOR ART

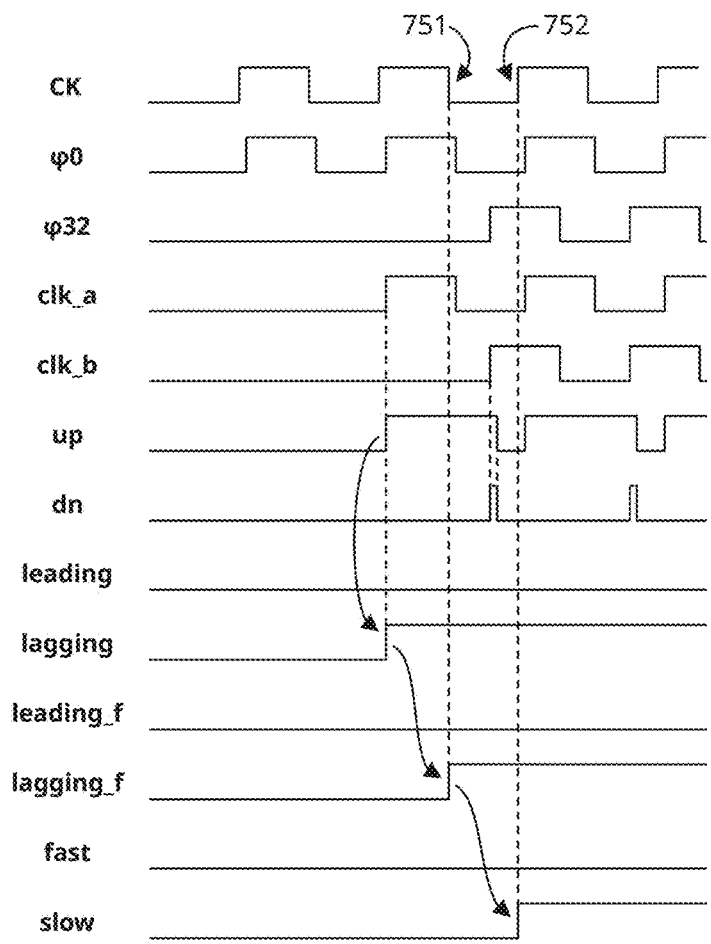
FIG. 7 - continued

DELAY-LOCKED LOOP WITH WIDENED LOCK RANGE

CROSS-REFERENCE

This application claims the benefit of U.S. Provisional Patent Application No. 63/295,838, entitled, "Delay-Locked Loop with Widened Lock Range," filed on Dec. 31, 2021. The priority application is hereby incorporated by reference herein for all purposes.

RELATED PUBLICATIONS AND APPLICATIONS

This application is related to the following patent applications:

U.S. patent application Ser. No. 17/338,620, entitled "Variable-Length Clock Stretcher with Correction for Glitches Due to Finite DLL Bandwidth," filed Jun. 3, 2021;

U.S. patent application Ser. No. 17/338,625, entitled "Variable-Length Clock Stretcher with Correction for Glitches Due to Phase Detector Offset," filed Jun. 3, 2021;

U.S. patent application Ser. No. 17/338,626, entitled "Variable-Length Clock Stretcher with Correction for Digital DLL Glitches," filed Jun. 3, 2021; and U.S. patent application Ser. No. 17/338,629, entitled "Variable-Length Clock Stretcher with Passive Mode Jitter Reduction," filed Jun. 3, 2021; and U.S. patent application Ser. No. 17/405,913, entitled "Variable-Length Clock Stretcher with Combiner Timing Logic," filed Aug. 18, 2021.

The related applications are hereby incorporated by reference herein for all purposes.

BACKGROUND

Technical Field

The disclosed implementations relate generally to systems and methods used in clocking electronics, and in particular to those clocking delay-locked loops (DLLs).

Context

Unless otherwise indicated herein, elements described in this section are not prior art to the claims and are not admitted being prior art by inclusion in this section.

Many digital and mixed-signal systems use delay-locked loops (DLLs) for timing. A DLL creates one or more delayed copies of an input signal, locking the delays to the cycle time of the input signal. To do so, the DLL uses a phase detector to compare the phase of a delayed copy to the phase of the input signal, and locks them, for example at a phase difference of 360 degrees. The DLL typically creates the delayed copies in a delay line whose speed can be controlled. If the phase of the delayed copy is more than 360 degrees delayed from the input signal, then the delay line is too slow, and the DLL speeds it up. If the phase of the delayed copy is less than 360 degrees delayed from the input signal, the DLL slows the delay line down.

SUMMARY

In a first aspect, an implementation provides a delay-locked loop (DLL). The DLL has a DLL signal input. The DLL includes a delay line, a gater, a phase-frequency detector (PFD), a retimer, and a loop filter.

The delay line has a series of delay stages. It has a signal input coupled with the DLL signal input. It further has a speed control input, a first phase output, and a second phase output.

The gater has a first gater input, a second gater input, a gater clock input, a first gater output, and a second gater output. The first gater input is coupled with the first phase output, and the second gater input is coupled with the second phase output. The gater clock input is coupled with the DLL signal input. The gater copies signals from the first gater input to the first gater output, apart from a first pulse. It also copies signals from the second gater input to the second gater output.

The PFD has a first PFD input, a second PFD input, a first PFD output, and a second PFD output. The first PFD input is coupled with the first gater output, and the second PFD input is coupled with the second gater output. The PFD may include a phase detector.

The retimer has a first retimer input, a second retimer input, a retimer clock input, a first retimer output, and a second retimer output. The first retimer input is coupled with the first PFD output, and the second retimer input is coupled with the second PFD output. The retimer clock input is coupled with the DLL signal input. The retimer may synchronize signals on the first retimer input with signals on the retimer clock input and output the synchronized signals on the first retimer output. The retimer may synchronize signals on the second retimer input with signals on the retimer clock input and output the synchronized signals on the second retimer output.

The loop filter has a first loop filter input, a second loop filter input, and a speed control output. The first loop filter input is coupled with the first retimer output, and the second loop filter input is coupled with the second retimer output. The speed control output is coupled with the delay line speed control input. The loop filter may be analog or digital. The loop filter may include an infinite impulse response (IIR) filter, a finite impulse response (FIR) filter, or an up/down counter.

The gater may have an enable (EN) input and include four flipflops and two logic gates. The first flipflop has a D input coupled with the EN input, a clock input coupled with the gater clock input, and a Q output. The second flipflop has a D input coupled with the Q output of the first flipflop, a clock input coupled with the gater clock input, and a Q output. The third flipflop has a D input coupled with the Q output of the second flipflop, an inverting clock input coupled with the first gater input, and a Q output. The fourth flipflop has a D input, an inverting clock input coupled with the second gater input, and a Q output. The first logic gate has a first input coupled with the Q output of the third flipflop, a second input coupled with the first gater input, and an output coupled with the first gater output. The second logic gate has a first input coupled with the Q output of the fourth flipflop, a second input coupled with the second gater input, and an output coupled with the second gater output.

In a second aspect, an implementation provides a method to lock a phase output signal to a phase input signal. The method has the following steps. In a delay line with a delay line signal input and a speed control input, receiving the phase input signal at the delay line signal input and delaying the phase input signal to obtain a first delayed signal, a second delayed signal, and the phase output signal. In a gater, copying the first delayed signal apart from a first pulse to output a first gater output signal, and copying the second delayed signal to output a second gater output signal. In a phase-frequency detector (PFD), asserting a first PFD output signal when the PFD receives a first gater output signal, asserting a second PFD output signal when the PFD receives a second gater output signal, and deasserting the first PFD output signal and the second PFD output signal when both the first gater output signal and the second gater output signal are asserted. In a loop filter, generating a speed control signal from the first PFD output signal and the second PFD output signal, wherein either (i) the speed control signal increases when the loop filter receives a first PFD output signal and decreases when the loop filter receives a second PFD output signal; or (ii) the speed control signal decreases when the loop filter receives a first PFD output signal and increases when the loop filter receives a second PFD output signal. In the delay line, changing the delay speed based on the speed control signal, wherein either the delay speed increases when the second delayed signal lags the first delayed signal and decreases when the second delayed signal leads the first delayed signal.

Particular aspects of the technology disclosed are described in the claims, specification and drawings.

BRIEF DESCRIPTION OF THE DRAWINGS

The technology will be described with reference to the drawings:

FIG. 1 illustrates a conventional delay-locked loop.

FIG. 2 illustrates synchronization in a conventional DLL.

FIG. 3 illustrates correct operation of a DLL in the phase range of −180 to +180 degrees.

FIG. 4 illustrates incorrect operation of a conventional DLL if the phase difference is larger than 180 degrees.

Figure 5:
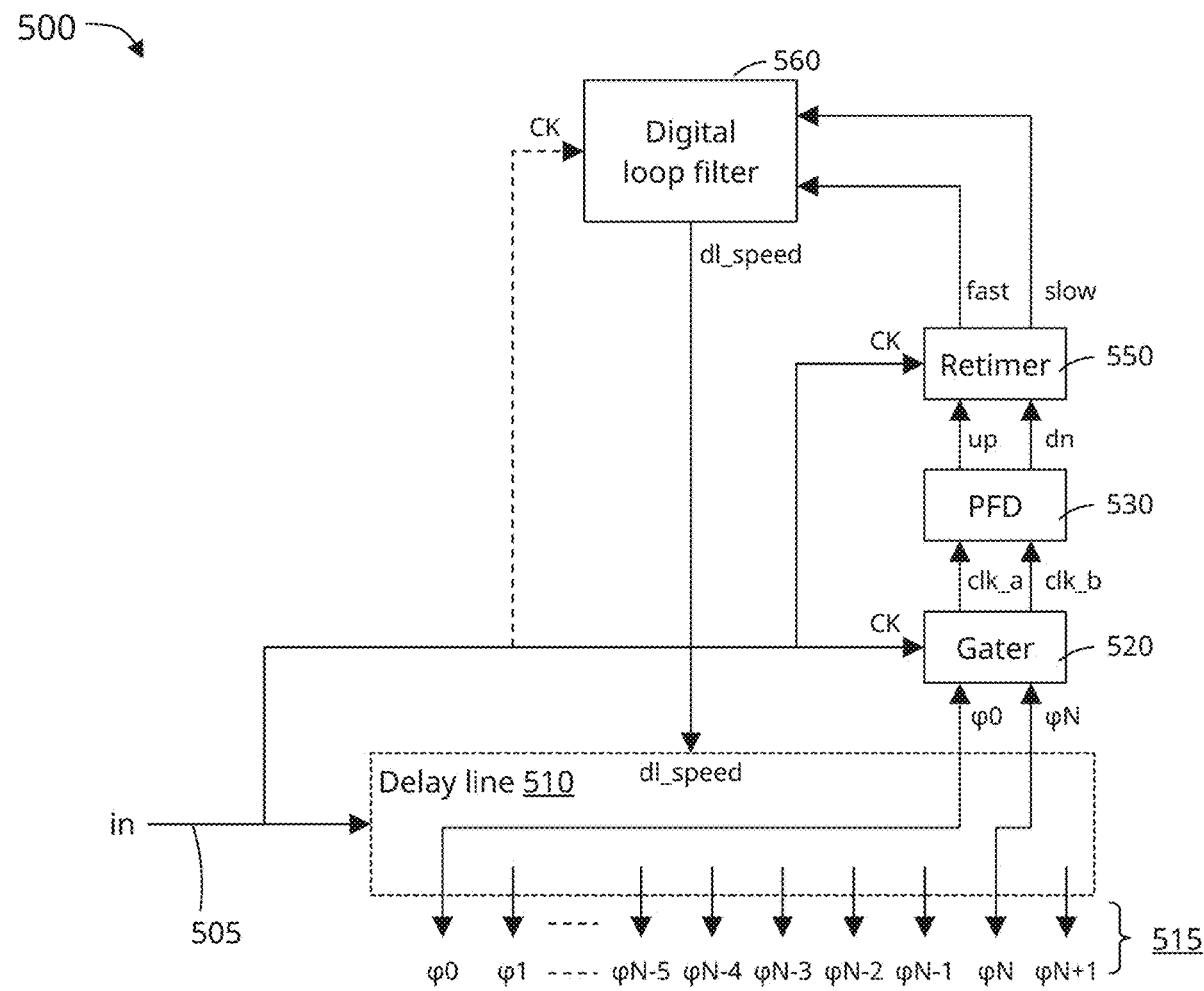
FIG. 5 illustrates a first implementation of a delay-locked loop with extended phase range.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope as claimed. Instead, they merely represent examples of different implementations of the technology.

DETAILED DESCRIPTION

The technology disclosed herein allows for a delay-locked loop (DLL) to have a lock range that is larger than 180 degrees, or 50% of the input cycle time. This can provide more reliable operation, from which many electronic systems that rely on a DLL would benefit. Conventional DLLs have a −180 to +180 degrees lock range because they cannot distinguish the present input clock pulse from a previous or future clock pulse. The present technology overcomes this problem.

Terminology

As used herein, the phrase one of should be interpreted to mean exactly one of the listed items. For example, the phrase "one of A, B, and C" should be interpreted to mean any of: only A, only B, or only C.

As used herein, the phrases at least one of and one or more of should be interpreted to mean one or more items. For example, the phrase "at least one of A, B, and C" or the phrase "at least one of A, B, or C" should be interpreted to mean any combination of A, B, and/or C. The phrase "at least one of A, B, and C" means at least one of A and at least one of B and at least one of C.

Unless otherwise specified, the use of ordinal adjectives first, second, third, etc., to describe an object, merely refers to different instances or classes of the object and does not imply any ranking or sequence.

The following terms or acronyms used herein are defined at least in part as follows:

AI—Artificial Intelligence.

CMOS—Complementary Metal-Oxide-Semiconductor—a type of field-effect transistor integrated circuit fabrication process.

DAC—digital-to-analog converter

Delay line—in the context of this document, a delay line is an electronic circuit composed of a series of delay stages through which a signal may travel. The delay stages are nominally equidistant, i.e., the provide equal delays. In practice, even equidistant delay stages may have delay deviations, resulting in output noise. At least part of the delay stages may have an output, and the outputs provide progressively delayed versions of a signal traveling through the delay line.

DLL—delay-locked loop—an electronic circuit with a delay line that synchronizes the delay line speed with the clock cycle of a reference input signal. It outputs one or more delayed versions of the reference input signal on one or more delay line outputs.

FET—Field-Effect Transistor

IC—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

JFET—Junction Field-Effect Transistor.

MCM—Multichip Module—an electronic package that includes multiple ICs performing as a single module.

MESFET—metal-semiconductor field-effect transistor.

NAND—Not And—a Boolean function.

NOR—Not Or—a Boolean function.

MOSFET—a metal-oxide-semiconductor field-effect transistor, the predominant type of transistor used in digital and mixed-signal ICs.

PCB—Printed Circuit Board

PD—phase detector

PFD—phase-frequency detector

PVT—semiconductor die conditions that impact the behavior of integrated electronic devices: process, voltage, and temperature.

SoC—system-on-a-chip—an IC that integrates a large amount of functionality.

Introduction

FIG. 1 illustrates a conventional delay-locked loop (DLL 100). DLL 100 may include delay line 110, phase detector PD 140, digital-to-analog converter DAC or charge pump 150, and loop filter 160. In a DLL with a fully digital control system, DAC or charge pump 150 is absent, and loop filter 160 is a digital filter, for example a finite-impulse-response (FIR) or infinite-impulse-response (IIR) filter.

Delay line 110 includes a series of delay stages 112 $\Delta t$, through which an input signal 105 travels. The speed of the delay stages 112 is controlled by a dl_speed signal, which may be processed by an optional delay line speed control block 117. The dl_speed signal, or its processed version, may be a supply voltage for delay stages 112, or any other quantity that impacts the speed of a delay stage. Delay stages are often implemented as simple logic gates, such as inverters, NAND gates, or NOR gates. The speed of a logic gate may be influenced in a few different ways that are well known in the art, including changing its supply voltage or current, or its body or back-gate voltage. Other well-known methods include changing the load capacitance. Each of the delay stages 112 may have an output for an output signal $\varphi$, and if all delay stages have equal delays, then the output 115 signals $\varphi$ may be equidistant signals. DLL 100 may lock the speed of delay line 110 to the clock cycle of input signal 105 by enforcing that the phase difference between signals $\varphi_0$ and $\varphi_N$, the output of the $N^{th}$ delay stage, equals 360 degrees. The input signal 105, which is represented by $\varphi_0$, may have been delayed by one or more additional optional input stages 113, which may be internal or external to delay line 110.

PD 140 has two inputs that are coupled with delay line 110, and receives two signals that are N stages apart, such as signals $\varphi_0$ and $\varphi_N$ in the case drawn. It compares the signals, and outputs a signal that indicates whether $\varphi_N$ leads or lags $\varphi_0$. Its output signal controls DAC or charge pump 150, which converts it to an analog signal for loop filter 160. If the PD 140 output signal is pulse-width-modulated, or if loop filter 160 is a digital filter, the PD 140 output signal may be directly provided to loop filter 160. Loop filter 160 may include an integrator or another low-pass filter, and its output signal dl_speed may be proportional with the required speed of the delay stages 112.

Many variations of the architecture of DLL 100 are known and common in the art.

FIG. 2 illustrates synchronization in a conventional DLL. This detail 200 of FIG. 1 shows 1+delay stages, with output signals $\varphi_0$ through $\varphi_N$. The signal $\varphi_0$ is delayed N times. Each of the delay stages ideally delays the signal by an equal amount $\Delta t$, which can be controlled by the dl_speed signal. The dl_speed signal may be an analog or a digital signal. DLL 100 ensures an integer times 360-degree phase difference between $\varphi_0$ and $\varphi_N$, by measuring the phase difference in PD 140 and using the measured difference as an error signal in a negative feedback loop that generates the dl_speed signal. A typical conventional DLL fixes the phase difference between $\varphi_0$ and $\varphi_N$ at 360 degrees. PD 140 asserts an output signal leading when $\varphi_N$ has a phase difference with $\varphi_0$ that is less than 360 degrees, and an output signal lagging when $\varphi_N$ has a phase difference with $\varphi_0$ that is more than 360 degrees. When the DLL is in lock, the phase difference is 360 degrees, and neither leading nor lagging is asserted, or they are asserted in equal proportions of the time.

FIG. 3 illustrates correct operation of a DLL in the phase range of −180 to +180 degrees. In this example, there are 32+1 phase outputs $\varphi_0$ through $\varphi_{32}$. The timing diagram 300 shows the signals $\varphi_0$ and $\varphi_{32}$, where $\varphi_{32}$ arrives too early (it is leading), and timing diagram 350 shows the signals $\varphi_0$ and $\varphi_{32}$, where $\varphi_{32}$ arrives too late (it is lagging). In the former case, the PD outputs are: leading=1; lagging=0. In the latter case, the PD outputs are: leading=0; lagging=1. These results are correct.

FIG. 4 illustrates incorrect operation of a conventional DLL if the phase difference is larger than 180 degrees. Unfortunately, conventional DLLs have a limited lock range. This is due to the phase detector: if a clock arrives more than half a period early (or late), then the PD compares it with an earlier (or later) cycle and perceives it as late (or early, respectively). When the two PD outputs drift more than half a cycle apart, the DLL becomes unstable. This limits the frequency range over which the DLL can be used, and it reduces the operating conditions (temperature range, supply voltage range). The operating conditions are also dependent on process variations.

The timing diagram 400 shows phase output signals $\varphi_0$ and $\varphi_{32}$, where $\varphi_{32}$ arrives more than half a clock cycle too early (it is leading more than 180 degrees). The timing diagram 450 shows the signals $\varphi_0$ and $\varphi_{32}$, where $\varphi_{32}$ arrives more than half a clock cycle too late (it is lagging more than 180 degrees). Due to the limited range over which the PD functions correctly, in the former case, the PD outputs are: leading=0; lagging=1. In the latter case, the PD outputs are: leading=1; lagging=0. Those results are incorrect.

When the input clock signal has a duty cycle of 50%, the conventional DLL has a lock range from 180 to 540 degrees respective to a central frequency that may be determined by the operating temperature, the supply voltage, and by semiconductor process manufacturing variations. If the operating frequency is different than the central frequency, the lock range reduces on at least one side. The lock range may be further impacted by noise margins.

Implementations

FIG. 5 illustrates a first implementation of a delay-locked loop (DLL 500) with extended phase range. DLL 500 has a DLL signal input 505, and one or more external phase outputs, each coupled with a delay line 510 phase output 515. An implementation derives an internal clock signal CK from the input signal at DLL signal input 505. DLL 500 further includes gater 520, a phase-frequency detector (PFD 530), retimer 550, and loop filter 560. If loop filter 560 is analog, then the implementation may further include a charge pump. Retimer 550 synchronize the PFD 530 output signals (up and dn) to the operation of loop filter 560 if loop filter 560 is a digital filter that is clocked by the CK signal. Whereas the up and dn input signals of retimer 550 may not be aligned with CK and the operation of loop filter 560, the retimer 550 output signals fast and slow are aligned with CK and the operation of loop filter 560. Retimer 550 is also needed to identify the end of a chain of pulses and restart gater 520. In a negative feedback loop, loop filter 560 delivers a speed control signal dl_speed to delay line 510. Delay line 510 includes a series of delay stages, and has a signal input coupled with DLL signal input 505, a speed control input (for the dl_speed control signal), a first phase output (for the $\varphi_0$ signal), and a second phase output (for the $\varphi_N$ signal). Gater 520 and PFD 530 are coupled between delay line 510 and retimer 550. Retimer 550 has outputs coupled with inputs of loop filter 560. Gater 520 receives the phase signals $\varphi_0$ and $\varphi_N$, and its function is to remove an initial clock pulse from the phase signal $\varphi_0$ (or alternatively, to delay the phase signal $\varphi_0$ by one full cycle). At its outputs, gater 520 delivers the signals clk_a, which copies (or passes) phase signal $\varphi_0$ with the initial clock pulse removed, and clk_b, which copies (or passes) phase signal $\varphi_N$. The inputs of PFD 530 are coupled with the outputs of gater 520. PFD 530 functions as any phase-frequency detector known in the art. It delivers its two output signals up and dn based on the order of receiving the signals clk_a and clk_b. Loop filter 560 may be a digital filter, for example including an infinite impulse response (IIR), a finite impulse response (FIR) filter, an up/down counter, or it may be an analog filter preceded by a charge pump.

Figure 6:
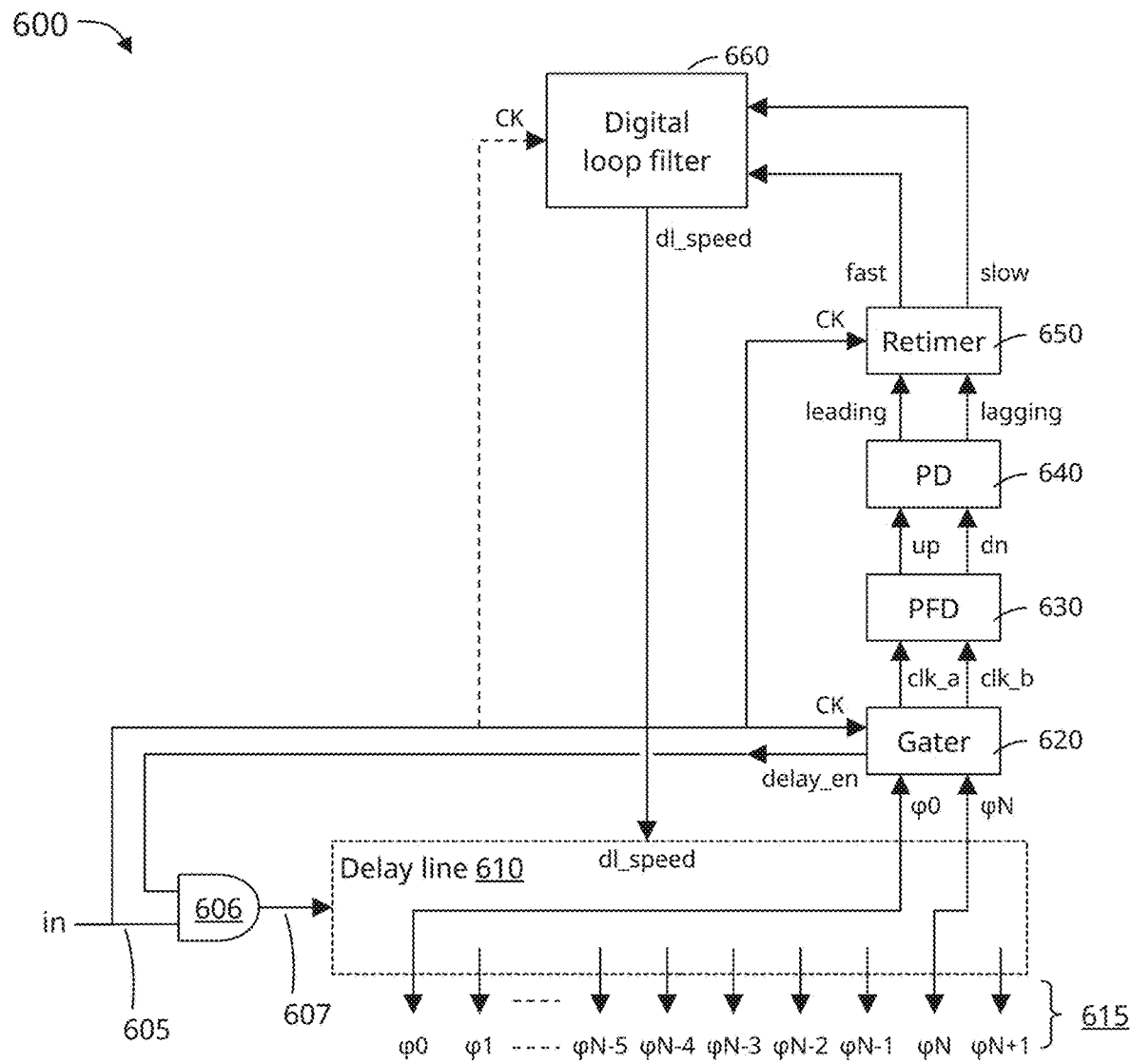
FIG. 6 illustrates a second implementation of a delay-locked loop with extended phase range.

FIG. 6 illustrates a second implementation of a delay-locked loop (DLL 600) with extended phase range. DLL 600 has a DLL signal input 605 and one or more external phase outputs 615, each coupled with a delay line phase output. An implementation derives an internal clock signal CK from the signal at DLL signal input 605. DLL 600 includes delay line 610, gater 620, phase-frequency detector PFD 630, phase detector PD 640, retimer 650, and loop filter 660. It may further include a logic gate 606 with a first input coupled with DLL signal input 605 and a second input coupled with a delay enable output of gater 620. At an output, logic gate 606 delivers a gated input signal to delay line input 607. Logic gate 606 may include an AND gate as drawn, a NAND gate, or any other gate or gates. Delay line 610 includes a series of delay stages, the first one of which is coupled with delay line input 607, and has a speed control input, a first phase output $\varphi_0$, and a second phase output $\varphi_N$. Gater 620 has two inputs, coupled with the first phase output $\varphi_0$ and the second phase output $\varphi_N$, and two outputs (clk_a and clk_b). PFD 630 has two inputs coupled with gater 620 to receive clk_a and clk_b, and two outputs (up and dn (down)). PD 640 has two inputs coupled with PFD 630 to receive up and dn and two outputs (leading and lagging). Retimer 650 has two inputs coupled with PD 640 to receive leading and lagging, and two outputs (fast and slow). Loop filter 660 has a first input coupled with the first retimer output (to receive the fast signal) and a second input coupled with the second retimer output (to receive the slow signal), and a speed control output coupled with the delay line speed control input. Loop filter 660 may be a digital filter, for example including an infinite impulse response (IIR), a finite impulse response (FIR) filter, an up/down counter, or it may be an analog filter preceded by a charge pump.

Gater 620 receives the phase signals $\varphi_0$ and $\varphi_N$, and its function is to remove an initial clock pulse from the phase signal $\varphi_0$ (or alternatively, to delay the phase signal $\varphi_0$ by one full cycle). At its outputs it delivers the signals clk_a, which copy phase signal $\varphi_0$ with the initial clock pulse removed, and clk_b, which equals phase signal $\varphi_N$. Gater 620 further has a clock input to receive the CK signal. In some implementations, gater 620 has a delay enable output to deliver the delay_en signal for logic gate 606.

PFD 630 functions as any phase-frequency detector known in the art. It delivers output signals up and dn (down) based on the order of receiving the signals clk_a and clk_b. Its outputs are coupled with the inputs of PD 640, which delivers the signals leading and lagging to retimer 650. The function of retimer 650 is to sample the leading and lagging signals at the output of PD 640 and synchronize the sampled signals with the clock CK, in case loop filter 660 is a digital filter. For example, retimer 650 may sample leading and lagging or up and dn at the falling edge of CK, and synchronize the sampled signal with the rising edge of CK.

As mentioned with reference to FIG. 1, many variations of the architecture of a DLL are known in the art, and many such variations may be applied to the architecture of DLL 600, without deviating from the ambit and scope of the technology disclosed herein.

Figure 7:
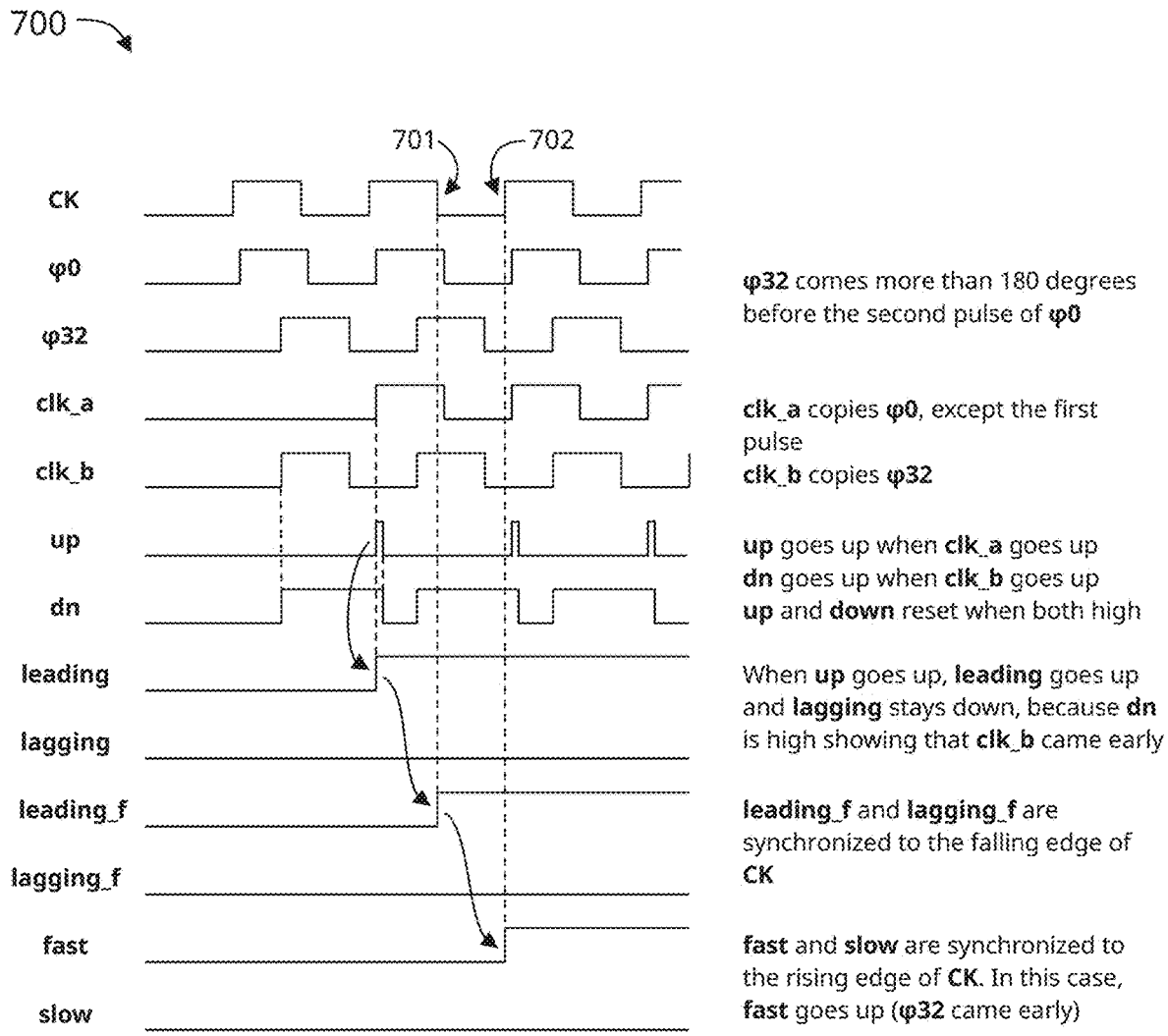
FIG. 7 illustrates example timing diagrams of the delay-locked loop with extended phase range from FIG. 6.

FIG. 7 illustrates example timing diagram 700 and timing diagram 750 of the delay-locked loop with extended phase range from FIG. 6. In these examples, the DLL is programmed or configured to output equidistant phase signals, for example signals $\varphi_0$ through $\varphi_{32}$ (N=0 ... 32). The DLL synchronizes $\varphi_{32}$ to coincide with $\varphi_0$ for a phase difference of 360 degrees, or one clock cycle. Timing diagram 700 shows an example where the delay line is much too fast, so that $\varphi_{32}$ has a phase difference of 150 degrees with $\varphi_0$. A conventional DLL would interpret this as $\varphi_{32}$ arriving 150 degrees late rather than 210 degrees early. Timing diagram 750 shows an example where the delay line is much too slow, so that $\varphi_{32}$ has a phase difference of 570 degrees with $\varphi_0$. A conventional DLL would interpret this as $\varphi_{32}$ coming 150 degrees early rather than 210 degrees late.

The gater outputs the signals clk_a and clk_b, which are also the input signals for the PFD. The gater does not affect clk_b, which is a copy of $\varphi_{32}$. However, it suppresses the first pulse in $\varphi_0$, so that clk_a is a copy of $\varphi_0$ that misses the first pulse. In some implementations, the gater may just delay $\varphi_0$ by a full clock cycle to obtain clk_a.

The PFD receives clk_a and clk_b at its inputs, and delivers the signals up and dn at its outputs. The signals up and dn are inputs for the for the PD, whose outputs in turn are inputs for the retimer. In response to the clk_a signal, the PFD asserts its up output, and in response to the clk_b signal, the PFD asserts its dn output. When both up and dn are asserted, the PFD deasserts up and dn. As a result, if clk_a arrives before clk_b, then the up pulse is relatively long and the dn pulse is just a short spike. If clk_b arrives before clk_a, then the dn pulse is relatively long and the up pulse is just a short spike. The phase detector PD is now able to correctly determine which signal comes first, even when the phase difference is outside of the range of 180 to 540 degrees. The lock range of DLL 600 is from about 0 degrees up to about 720 degrees.

In timing diagram 700, clk_b rises first, and in response, the PFD raises the dn signal. When clk_a rises too, the PFD raises the up signal. However, as soon as both up and dn are asserted (raised), it resets both up and dn, and both signals become low again. Thus, the up signal is only a short spike, whereas the dn signal is relatively long.

The phase detector PD is digital with one-bit outputs (a bang-bang phase detector) carrying the leading and lagging signals. The phase detector determines which signal comes first, clk_a or clk_b. It responds to the rising edge of clk_a, i.e., the rising edge of the up signal. If dn is high, then clk_b and thus $\varphi_{32}$ came early. Thus, its output with the leading signal goes high, and lagging stays low. But if dn is low, then clk_b and thus $\varphi_{32}$ came late, and thus the leading signal stays low, and lagging goes high. In timing diagram 700, clk_b came early, and the dn signal is high, thus the leading signal goes high.

The retimer samples leading and lagging on the falling or inactive edge of CK, to generate internal signals leading_f and lagging_f. On the rising or active edge of CK, the retimer transfers the sampled values to its outputs fast and slow. Thus, if leading is high at the time of falling edge 701 of CK, then the fast signal will become high at the time of rising edge 702 of CK. If lagging is low at the time of falling edge 701, then slow will stay low at the time of rising edge 702.

In timing diagram 750, clk_a rises first, and in response, the PFD raises the up signal. When clk_b rises too, the PFD raises the dn signal. However, as soon as both up and dn are asserted (raised), it resets both up and dn, and both signals become low again. Thus, the dn signal is only a short spike, whereas the up signal is relatively long.

The phase detector PD determines which signal comes first, clk_a or clk_b, as described above. In timing diagram 750, clk_b comes later than clk_a. Thus, when clk_a goes up, up goes high, but dn is still low. As a result, the PD activates the lagging signal, whereas leading stays low.

The retimer samples leading and lagging on the falling or inactive edge of CK, to generate internal signals leading_f and lagging_f. On the rising or active edge of CK, the retimer transfers the sampled values to its outputs fast and slow. Thus, if lagging is high at the time of falling edge 751 of CK, then the slow signal will become high at the time of rising edge 752 of CK. If leading is low at the time of falling edge 751, then fast will stay low at the time of rising edge 752.

Figure 8:
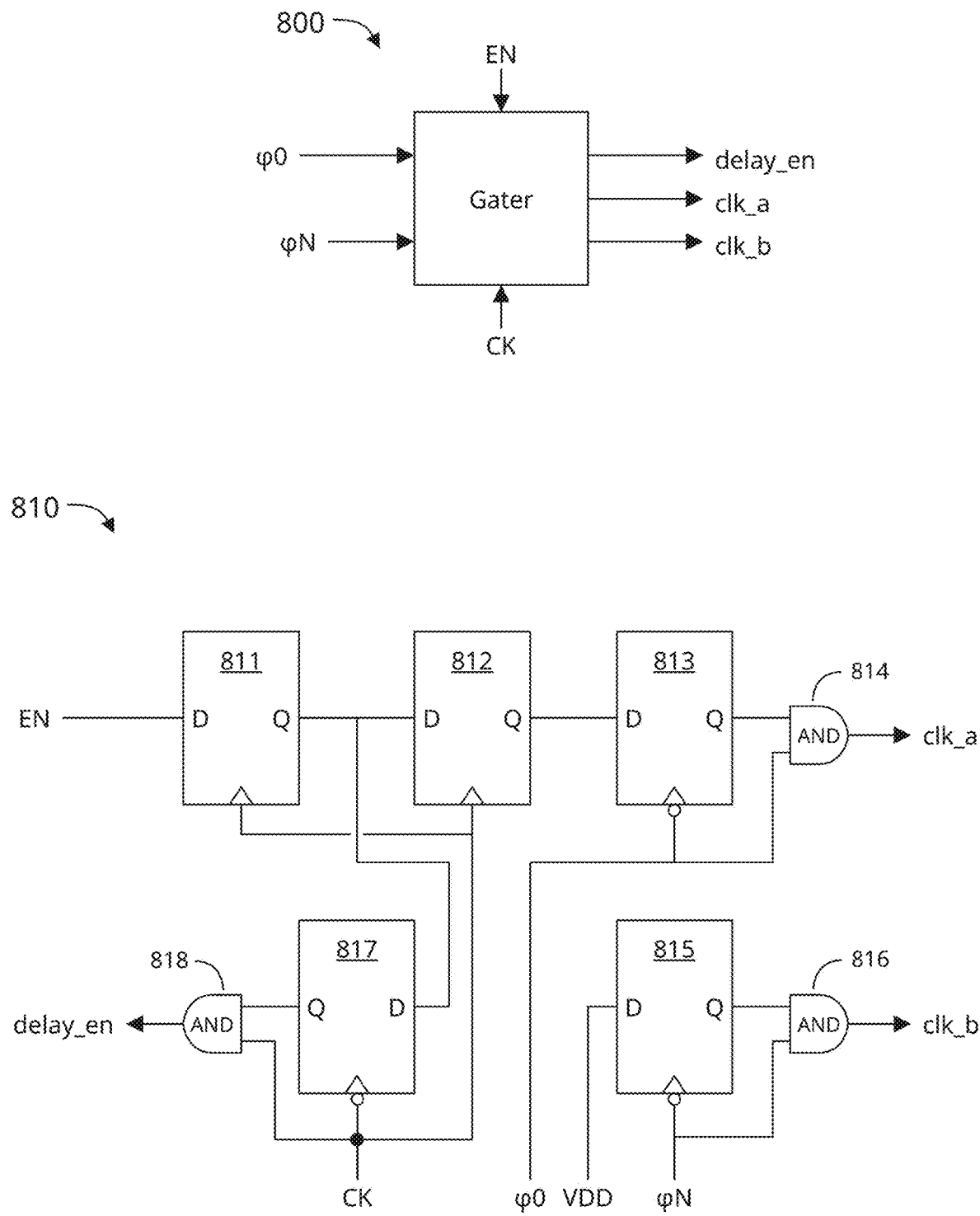
FIG. 8 illustrates an example top-level view and implementation of the gater.

FIG. 8 illustrates an example top-level view 800 and an implementation 810 of the gater. Top-level view 800 shows its inputs for the signals $\varphi_0$ and $\varphi_N$ and its outputs for the signals clk_a and clk_b signals. An implementation may further have a clock input CK, an enable input EN, and a delay enable output delay_en. In DLL 600, CK may be coupled with the DLL signal input 605 in. The signal EN may be used when the DLL starts.

Implementation 810 includes D-flipflop 811, D-flipflop 812, D-flipflop 813 and logic gate 814, D-flipflop 815 and logic gate 816, D-flipflop 817, and logic gate 818. D-flipflop 811 has a D input coupled with the EN input, a clock input coupled with the clock input CK, and a Q output. D-flipflop 812 has a D input coupled with the Q output of D-flipflop 811, a clock input coupled with the clock input CK, and a Q output. D-flipflop 817 also has a D input coupled with the Q output of D-flipflop 811, an inverting clock input coupled with the clock input CK, and a Q output. Logic gate 818, which may include an AND gate, a NAND gate, and/or any other gate(s), has a first input coupled with the Q output of D-flipflop 817, a second input coupled with the clock input CK, and an output coupled with the delay enable output delay_en. D-flipflop 813 has a D input coupled with the Q output of D-flipflop 812, an inverting clock input coupled with the $\varphi_0$ input, and a Q output. Logic gate 814, which may include an AND gate, a NAND gate, and/or any other gate(s), has a first input coupled with the Q output of D-flipflop 813, a second input coupled with the $\varphi_0$ input, and an output coupled with the clk_a output. D-flipflop 815 has a D input coupled with a logical "1" (VDD) signal, an inverting clock input coupled with the $\varphi_N$ input, and a Q output. Logic gate 816, which may include an AND gate, a NAND gate, and/or any other gate(s), has a first input coupled with the Q output of D-flipflop 815, a second input coupled with the $\varphi_N$ input, and an output coupled with the clk_b output.

As shown in implementation 810, when EN is high, delay_en is generated in a glitch-free fashion through D-flipflop 811 and clock gater D-flipflop 817 and logic gate 818. The signal on output clk_a is generated one cycle after delay_en. This is achieved by passing the D-flipflop 811 output signal through D-flipflop 812 and another clock gater D-flipflop 813 and logic gate 814. The signal on the $\varphi_N$ input could be directly transferred to output clk_b, but it is passed through another clock gater D-flipflop 815 and logic gate 816 that is always on, so that its delay matches the delay from $\varphi_0$ to clk_a.

In some implementations, the D input of D-flipflop 815 is not coupled with VDD, but with the Q output of D-flipflop 811. In those implementations, D-flipflop 815 is not always on, but is always on when the gater is enabled via the signal on the EN input.

Figure 9:
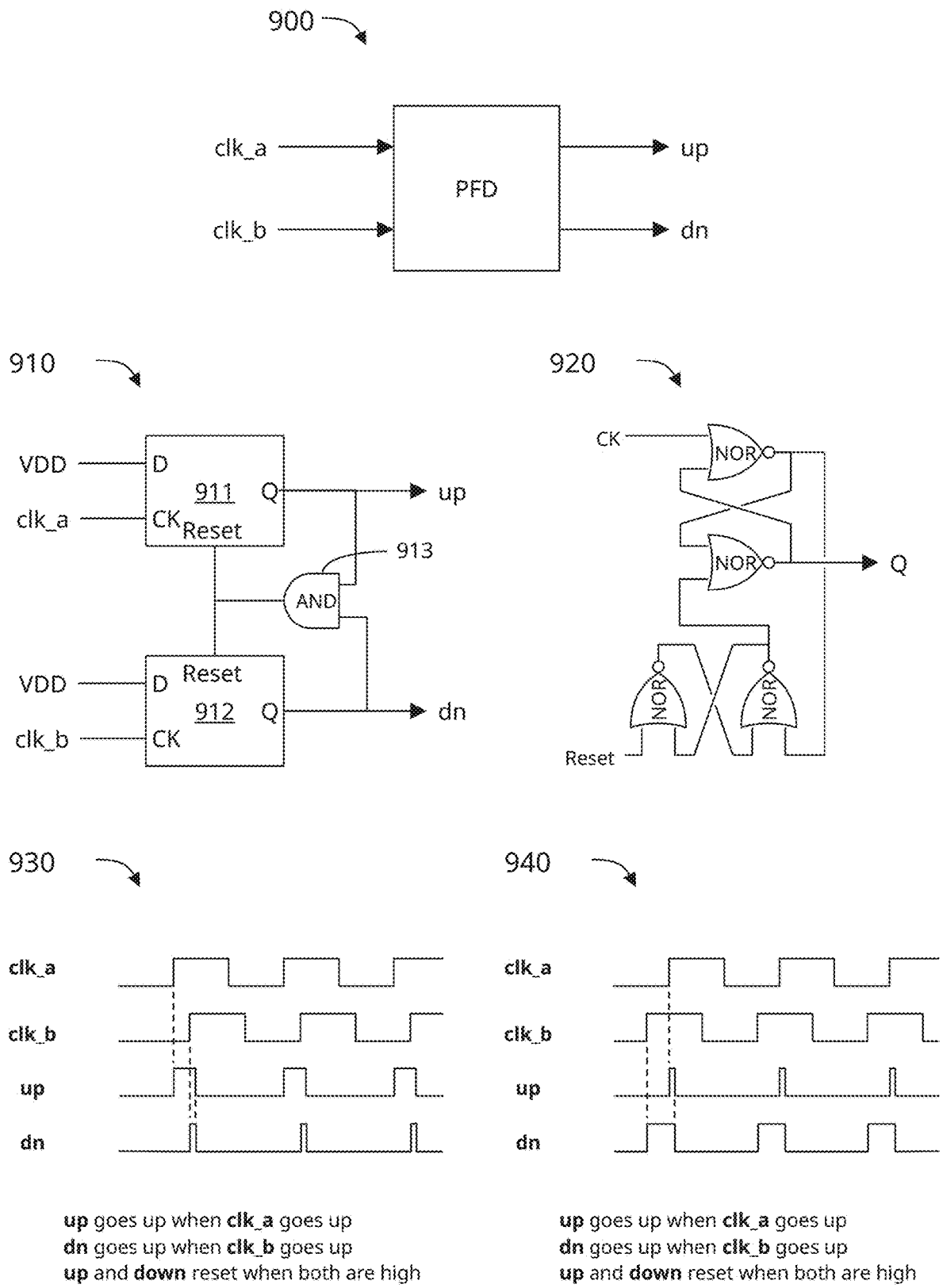
FIG. 9 illustrates an example top-level view and implementation of the phase-frequency detector.

FIG. 9 illustrates an example top-level view 900 and implementation 910 of the phase-frequency detector. The circuit diagram has been published in many textbooks. Top-level view 900 shows inputs clk_a and clk_b, and outputs up and dn. The PFD asserts its up output when it receives a signal on its clk_a input and it asserts its dn output when it receives a signal on its clk_b input. When both outputs are asserted, the PFD de-asserts the outputs. Implementation 910 show an example implementation, with flipflop 911, flipflop 912, and logic gate 913 which may include an AND gate, a NAND gate, and/or any other gate(s). For example, if logic gate 913 includes a NAND gate, then the reset inputs of flipflop 911 and flipflop 912 may be inverting reset inputs. Most PFD implementations known in the art will function in the disclosed technology. The circuit in implementation 910 may be built with two edge-triggered resettable D flipflops, whose D inputs are tied to logical "1" (VDD). The PFD inputs clk_a and clk_b are coupled with the flipflop clock inputs. The PFD outputs up and dn are coupled with the outputs of the respective flipflops.

When the up and dn outputs are both low, and clk_a goes high, then up rises. When this event is followed by a rising transition at clk_b, then dn goes high, and logic gate 913 resets the two flipflops. This is illustrated in timing diagram 930. Similarly, when the up and dn outputs are both low, and clk_b goes high, then dn rises. When this event is followed by a rising transition at clk_a, then up goes high, and logic gate 913 resets flipflop 911 and flipflop 912. This is illustrated in timing diagram 940. Circuit 920 shows an example implementation of a flipflop that can be used in the PFD.

Figure 10:
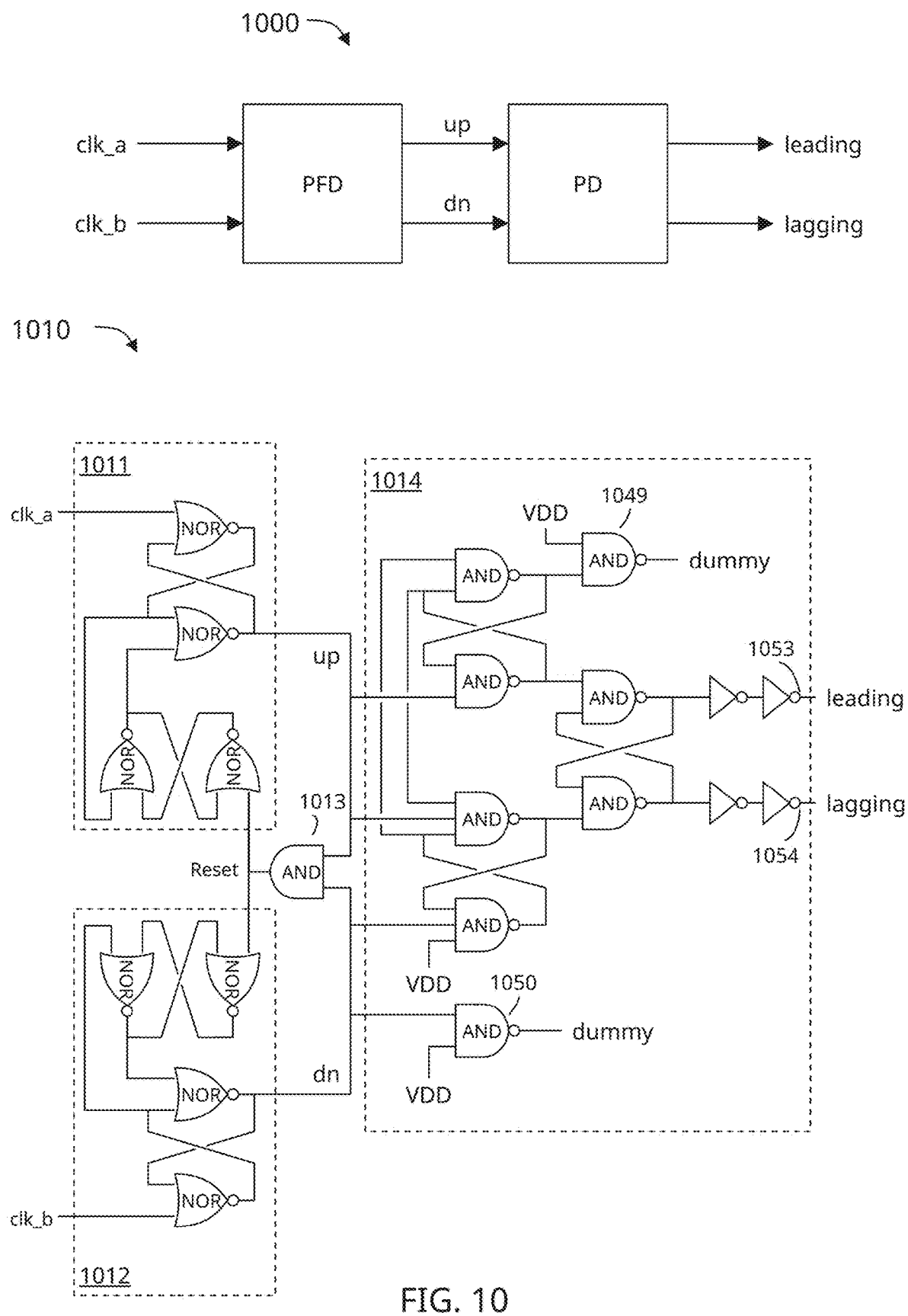
FIG. 10 illustrates an example top-level view and implementation of a phase-frequency detector/phase detector combination.

FIG. 10 illustrates an example top-level view and implementation of a phase-frequency detector/phase detector combination (PFD/PD top level view 1000 and PFD/PD implementation 1010). The PFD may be as described with reference to FIG. 9 including first flipflop 1011, second flipflop 1012, and logic gate 1013, and the PD may be a bang-bang phase detector, several of which are described in the art. For example, PDs are described in Chapter 6 (pp. 183-242) of "Clocking in Modern VLSI Systems" edited by Thucydides Xanthopoulos, Springer US (2009). The PD 1014 was first described in U.S. Pat. No. 5,101,117 by Mark G. Johnson and Edwin L. Hudson, entitled "Variable Delay Line Phase-Locked Loop Circuit Synchronization System," issued 31 Mar. 1992. Johnson and Hudson used their variant of the circuit with a charge pump and an analog loop filter. The circuit is described there as paraphrased in the following paragraph. Additional detail of its operation is provided by Xanthopoulos, who uses it with a digital loop filter.

PFD/PD implementation 1010 comprises an edge-triggered D-type flipflop which, on the rising edge of signal up samples signal dn and places the result on output line 1053 (leading) and output line 1054 (lagging). If up goes high after dn goes high, then output line 1054 (lagging) will be low and output line 1053 (leading) will be high. On the other hand, the opposite will be the case if dn goes high after up goes high. Gates 1049 and 1050 balance the loads being driven by the cross-coupled pairs of gates, thereby maintaining symmetrical operation at the same speed.

Figure 11:
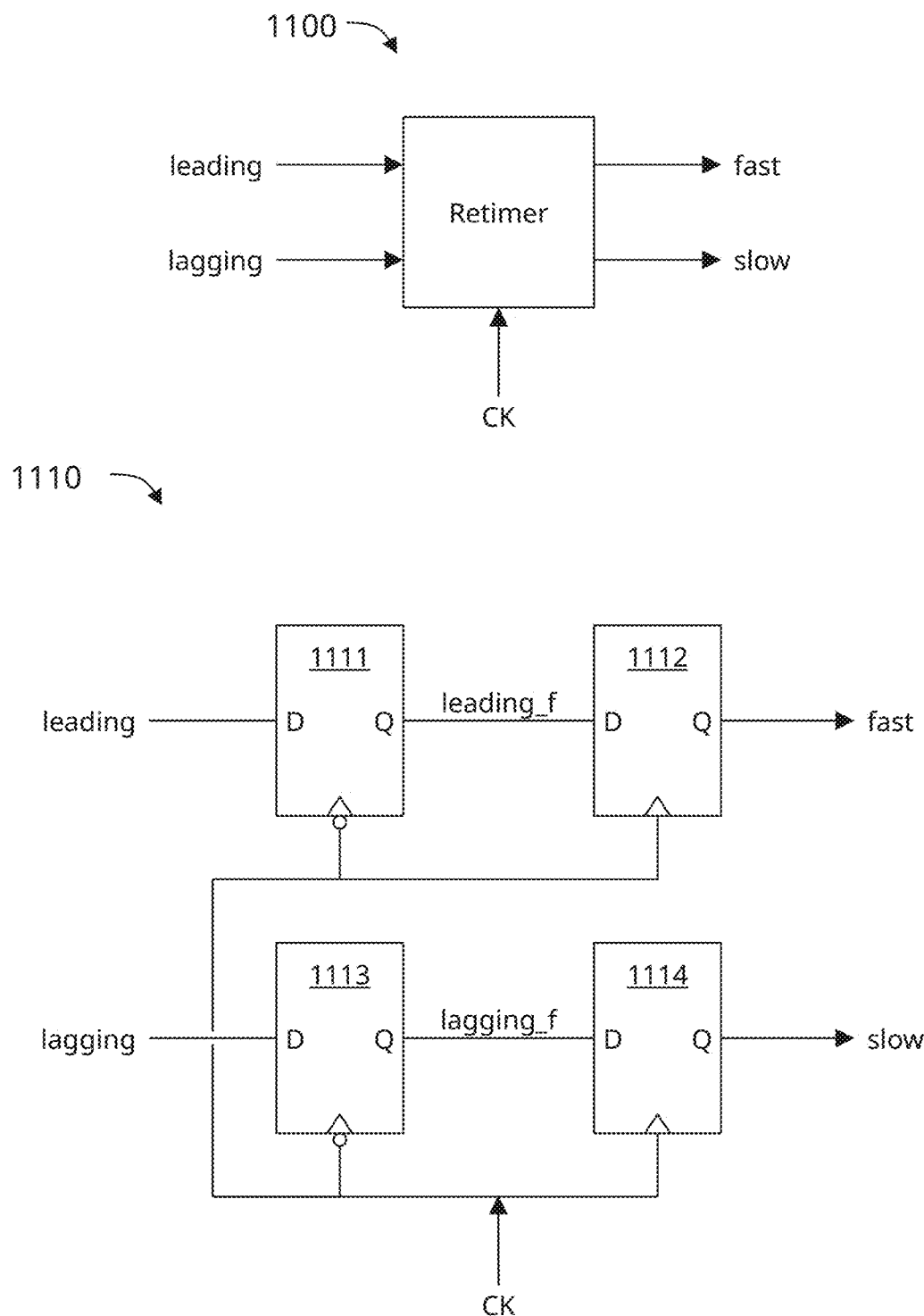
FIG. 11 illustrates an example top-level view and implementation of the retimer.

FIG. 11 illustrates an example top-level view 1100 and implementation 1110 of the retimer. Top-level view 1100 has an input for a leading signal, an input for a lagging signal, a CK input for a clock signal, an output for a fast signal, and an output for a slow signal.

Implementation 1110 includes D-flipflop 1111, D-flipflop 1112, D-flipflop 1113, and D-flipflop 1114. D-flipflop 1111 and D-flipflop 1113 each have an inverting clock input coupled with the CK input. Therefore, these flipflops are clocked on the falling (or inactive) edge of the clock pulse. D-flipflop 1112 and D-flipflop 1114 each have a non-inverting clock input coupled with the CK input, and are clocked on the rising (or active) edge of the clock pulse. D-flipflop 1111 has a D-input coupled with the input for the leading signal. D-flipflop 1111 outputs the leading_f signal. D-flipflop 1113 has a D-input coupled with the input for the lagging signal. D-flipflop 1113 outputs the lagging_f signal. D-flipflop 1112 has a D input coupled with the Q output of D-flipflop 1111 to receive the leading_f signal and D-flipflop 1114 has a D input coupled with the Q output of D-flipflop 1113 to receive the lagging_f signal. D-flipflop 1112 has a Q output coupled with the output for the fast signal. D-flipflop 1114 has a Q output coupled with the output for the slow signal.

When CK goes low (or is deasserted), D-flipflop 1111 samples the leading signal and its Q output (leading_f) assumes the value of the leading signal at the time of sampling. D-flipflop 1113 samples the lagging signal and its Q output (lagging_f) assumes the value of the lagging signal at the time of sampling. When subsequently CK goes high (or is asserted), D-flipflop 1112 samples the leading_f signal and its Q output (fast) assumes the value of the leading_f signal at the time of sampling. D-flipflop 1114 samples the lagging_f signal and its Q output (slow) assumes the value of the lagging_f signal at the time of sampling.

Figure 12:
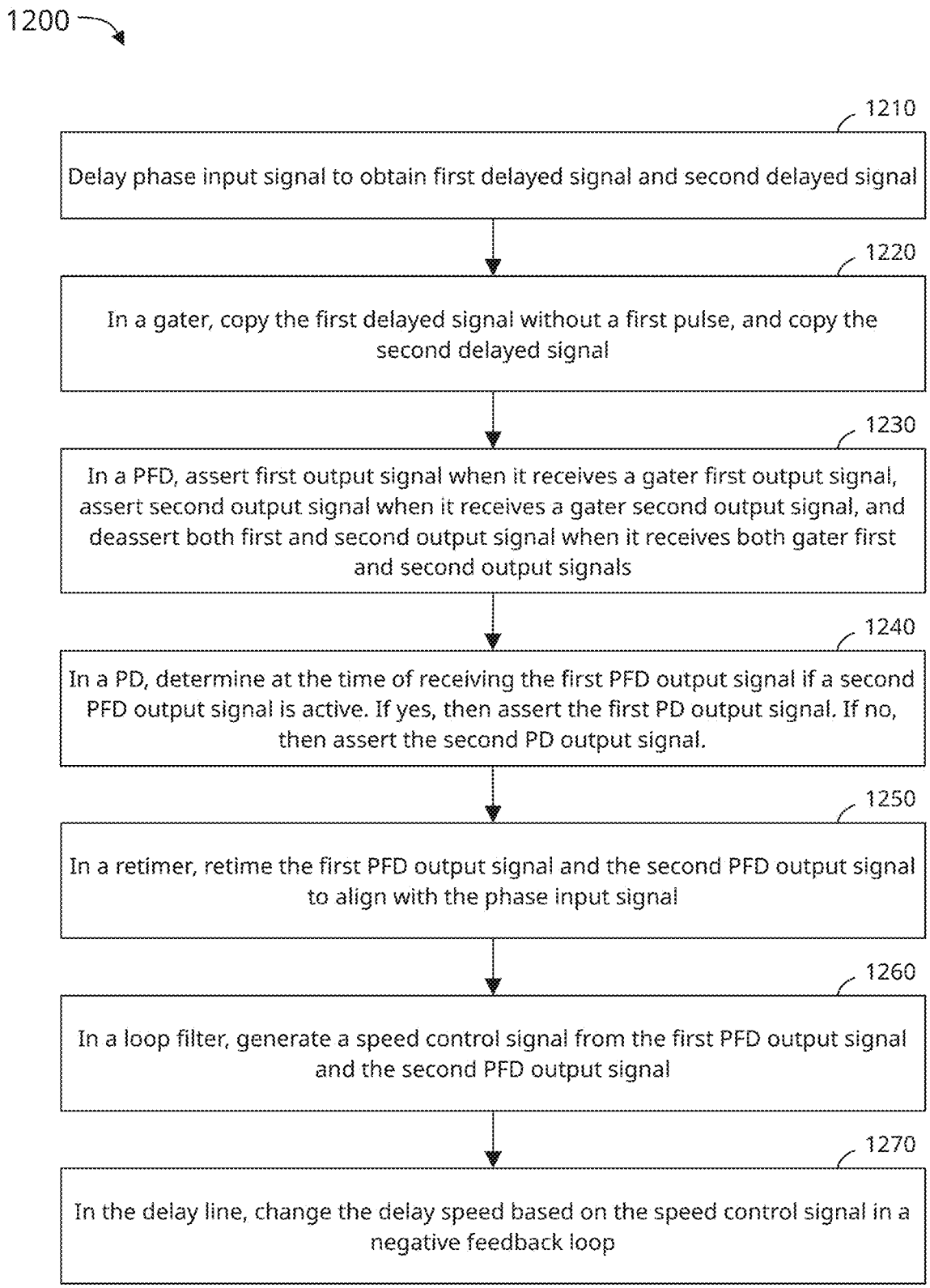
FIG. 12 illustrates an example method for locking a phase output signal to a phase input signal.

FIG. 12 illustrates an example method 1200 for locking a phase output signal to a phase input signal. Method 1200 comprises the following steps.

Step 1210—In a delay line with a delay line signal input and a speed control input, receive the phase input signal at the delay line signal input and delay the phase input signal to obtain a first delayed signal, a second delayed signal, and the phase output signal. In some implementations, the phase output signal may equal the second delayed signal.

Step 1220—In a gater, copy or pass the first delayed signal apart from a first pulse to output a first gater output signal, and copy the second delayed signal to output a second gater output signal. Some implementations copy or pass all pulses of the first delayed signal but delay the first delayed signal by a full cycle.

Step 1230—In a PFD, assert a first PFD output signal when the PFD receives a first gater output signal, assert a second PFD output signal when the PFD receives a second gater output signal, and deassert the first PFD output signal and the second PFD output signal when both the first gater output signal and the second gater output signal are asserted.

Step 1240—In a PD, at the time of receiving a first PFD output signal, determine if a second PFD output signal is active. In response to determining that the second output signal is active, assert a first PD output signal. In response to determining that the second output signal is not active, assert a second PD output signal.

Step 1250—In a retimer, retime the first PD output signal and the second PD output signal to align with the phase input signal.

Step 1260—In a loop filter, generate a speed control signal from the first PFD output signal and the second PFD output signal. The speed control signal increases when the loop filter receives a first PFD output signal and decreases when the loop filter receives a second PFD output signal. In some implementations, the speed control signal decreases when the loop filter receives a first PFD output signal and increases when the loop filter receives a second PFD output signal.

Step 1270—In the delay line, change the delay speed based on the speed control signal. The delay line receives the speed control signal from the loop filter, which forms a negative feedback loop that corrects the delay speed of the delay line based on the timing and duration of the phase input signal. Thus, the delay speed increases when the second delayed signal lags the first delayed signal and decreases when the second delayed signal leads the first delayed signal.

Considerations

We describe various implementations of circuits for providing a wider lock range to DLLs.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

What is claimed is:

1. A delay-locked loop (DLL) with a DLL signal input, comprising:
   a delay line including a series of delay stages, with a signal input coupled with the DLL signal input, a speed control input, a first phase output, and a second phase output;
   a gater with a first gater input coupled with the first phase output and a second gater input coupled with the second phase output, a gater clock input coupled with the DLL signal input, a first gater output and a second gater output;
   a phase-frequency detector (PFD) with a first PFD input coupled with the first gater output and a second PFD input coupled with the second gater output, and a first PFD output and a second PFD output;
   a retimer with a first retimer input coupled with the first PFD output, a second retimer input coupled with the second PFD output, a retimer clock input coupled with the DLL signal input, a first retimer output, and a second retimer output; and
   a loop filter with a first input coupled with the first retimer output and a second input coupled with the second retimer output, and a speed control output coupled with the speed control input.

2. The DLL of claim 1, further comprising:
   a phase detector (PD) coupled between the PFD and the retimer, with a first PD input coupled with the first PFD output and a second PD input coupled with the second PFD output, and a first PD output coupled with the first retimer input and a second PD output coupled with the second retimer input.

3. The DLL of claim 1, wherein:
   the loop filter comprises an infinite impulse response (IIR) filter.

4. The DLL of claim 1, wherein:
   the loop filter comprises a finite impulse response (FIR) filter.

5. The DLL of claim 1, wherein:
   the loop filter comprises an up/down counter.

6. The DLL of claim 1, wherein the gater is configured to:
   pass a first signal from the first gater input to the first gater output apart from a first pulse; and
   pass a second signal from the second gater input to the second gater output.

7. The DLL of claim 1, wherein the gater is configured to:
   delay a first signal from the first gater input for a full clock cycle and to pass the delayed first signal to the first gater output; and
   pass a second signal from the second gater input to the second gater output.

8. The DLL of claim 1, wherein the gater comprises:
   an enable (EN) input;
   a first flipflop with a D input coupled with the EN input, a clock input coupled with the gater clock input, and a Q output;
   a second flipflop with a D input coupled with the Q output of the first flipflop, a clock input coupled with the gater clock input, and a Q output;
   a third flipflop with a D input coupled with the Q output of the second flipflop, an inverting clock input coupled with the first gater input, and a Q output;
   a fourth flipflop with a D input, an inverting clock input coupled with the second gater input, and a Q output;
   a first logic gate with a first input coupled with the Q output of the third flipflop, a second input coupled with the first gater input, and an output coupled with the first gater output; and
   a second logic gate with a first input coupled with the Q output of the fourth flipflop, a second input coupled with the second gater input, and an output coupled with the second gater output.

9. The DLL of claim 8, wherein the gater further comprises:
   a fifth flipflop with a D input coupled with the Q output of the first flipflop, an inverting clock input coupled with the gater clock input, and a Q output; and
   a third logic gate with a first input coupled with the Q output of the fifth flipflop, a second input coupled with the gater clock input, and an output coupled with a third gater output.

10. The DLL of claim 1, wherein:
    the PFD comprises:
       a first flipflop with a first flipflop clock input coupled with the first PFD input, and a first flipflop output coupled with the first PFD output;
       a second flipflop with a second flipflop clock input coupled with the second PFD input, and a second flipflop output coupled with the second PFD output; and
       a logic gate with a first input coupled with the first PFD output and a second input coupled with the second PFD output, and an output coupled with a reset input of the first flipflop and coupled with a reset input of the second flipflop;
    the first flipflop asserts the first PFD output when the first flipflop clock input is asserted;
    the second flipflop asserts the second PFD output when the second flipflop clock input is asserted; and
    the logic gate resets the first flipflop and the second flipflop when both the first PFD output and the second PFD output are asserted.

11. The DLL of claim 1, wherein the PFD further comprises a phase detector (PD), and wherein:

at a time of receiving a first PFD output signal, the PD determines if a second PFD output signal is active;

in response to determining that the second PFD output signal is active, the PD asserts a first PD output signal; and in response to determining that the second PFD output signal is not active, the PD asserts a second PD output signal.

12. The DLL of claim 1, wherein the retimer comprises:

a first flipflop with a D input coupled with the first retimer input, an inverting clock input coupled with the gater clock input, and a Q output;

a second flipflop with a D input coupled with the Q output of the first flipflop, an inverting clock input coupled with the gater clock input, and a Q output;

a third flipflop with a D input coupled with the Q output of the second flipflop, a clock input coupled with the gater clock input, and a Q output coupled with the first retimer output;

a fourth flipflop with a D-input coupled with the second retimer input, an inverting clock input coupled with the gater clock input, and a Q output;

a fifth flipflop with a D input coupled with the Q output of the fourth flipflop, an inverting clock input coupled with the gater clock input, and a Q output; and a sixth flipflop with a D input coupled with the Q output of the fifth flipflop, a clock input coupled with the gater clock input, and a Q output coupled with the second retimer output.

13. A method to lock a phase output signal to a phase input signal, comprising:

in a delay line with a delay line signal input and a speed control input, receiving the phase input signal at the delay line signal input and delaying the phase input signal to obtain a first delayed signal, a second delayed signal, and the phase output signal;

in a gater, copying the first delayed signal apart from a first pulse to output a first gater output signal, and copying the second delayed signal to output a second gater output signal;

in a phase-frequency detector (PFD), asserting a first PFD output signal when the PFD receives a first gater output signal, asserting a second PFD output signal when the PFD receives a second gater output signal, and deasserting the first PFD output signal and the second PFD output signal when both the first gater output signal and the second gater output signal are asserted;

in a loop filter, generating a speed control signal from the first PFD output signal and the second PFD output signal, wherein either (i) the speed control signal increases when the loop filter receives a first PFD output signal and decreases when the loop filter receives a second PFD output signal; or (ii) the speed control signal decreases when the loop filter receives a first PFD output signal and increases when the loop filter receives a second PFD output signal; and in the delay line, changing the delay speed based on the speed control signal, wherein either the delay speed increases when the second delayed signal lags the first delayed signal and decreases when the second delayed signal leads the first delayed signal.

14. The method of claim 13, wherein the phase output signal equals the second delayed signal.

15. The method of claim 13, further comprising retiming the first PFD output signal and the second PFD output signal to align with the phase input signal.

16. The method of claim 13, wherein the PFD is combined with a phase detector (PD), and further comprising:

in the PD, at a time of receiving the first PFD output signal, determining if the second PFD output signal is active; in response to determining that the second output signal is active, asserting a first PD output signal; and in response to determining that the second output signal is not active, asserting a second PD output signal.

17. The method of claim 16, further comprising retiming the first PD output signal and the second PD output signal to align with the phase input signal.

* * * * *